United States Patent
Mao et al.

(10) Patent No.: US 7,482,244 B2
(45) Date of Patent: Jan. 27, 2009

(54) METHOD OF PREVENTING A PEELING ISSUE OF A HIGH STRESSED THIN FILM

(75) Inventors: Chih-Jen Mao, Tainan Hsien (TW); Hui-Shen Shih, Chang-Hua Hsien (TW); Kuo-Wei Yang, Hsin-Chu (TW); Chun-Han Chuang, Hsin-Chu (TW); Chun-Hung Hsia, Taipei Hsien (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 244 days.

(21) Appl. No.: 11/162,605

(22) Filed: Sep. 16, 2005

(65) Prior Publication Data
US 2007/0066026 A1 Mar. 22, 2007

(51) Int. Cl.
*H01L 21/76* (2006.01)
(52) U.S. Cl. .............. 438/424; 438/435; 438/436; 438/437; 438/778; 438/787; 438/788; 438/781; 118/729

(58) Field of Classification Search ............ 438/424, 438/435–437, 778, 787–788, 791; 118/715–733
See application file for complete search history.

(56) References Cited

U.S. PATENT DOCUMENTS

| | | | | |
|---|---|---|---|---|
| 5,057,463 A | * | 10/1991 | Bryant et al. | 438/762 |
| 6,074,927 A | * | 6/2000 | Kepler et al. | 438/400 |
| 6,817,903 B1 | * | 11/2004 | Ramkumar et al. | 439/702 |

FOREIGN PATENT DOCUMENTS
JP 63142822 * 6/1988

OTHER PUBLICATIONS

Danielsson, et al., "Reducing stress in silicon carbide epitaxial layers", 2003, Journal of Crystal Growth, 252 pp. 289-296.*

* cited by examiner

*Primary Examiner*—Zandra Smith
*Assistant Examiner*—Sonya D McCall Shepard
(74) *Attorney, Agent, or Firm*—Winston Hsu

(57) ABSTRACT

A wafer including a high stressed thin film thereon is lifted, and a pre-heating process is performed while the wafer is lifted. Subsequently, a dielectric layer is deposited on the high stressed thin film.

17 Claims, 10 Drawing Sheets

METHOD OF PREVENTING A PEELING ISSUE OF A HIGH STRESSED THIN FILM

BACKGROUND OF THE INVENTION

1. Field of the Invention

The present invention relates to a method of preventing a peeling issue of a high stressed thin film, and more particularly, to a method that includes a multi-step pre-heating process for improving the temperature rising capability. Consequently, the peeling issue of the high stressed thin film is avoided.

2. Description of the Prior Art

Silicon nitride is known as a good dielectric material for its good dielectric and insulating characteristics, and has been widely used as the materials of interlayer dielectric, dielectric liner, passivation layer, and so on. However, the high stress of silicon nitride has always been a problem during semiconductor processes. The high stress makes the silicon nitride layer have a poor interface between itself and the layer in contact with the silicon nitride layer. Consequently, the silicon nitride layer tends to peel and leads to peeling and particle issues. The peeling issue gets serious while the temperature rising capability is poor. An STI process is exemplarily described thereinafter to illustrate the peeling issue and the particle issue of a high stressed thin film.

Please refer to FIG. 1. FIG. 1 is a flow chart of a conventional STI process. As shown in FIG. 1, the conventional STI process includes the following steps:

Step 10: providing a wafer having shallow trenches;

Step 12: forming a silicon nitride liner on the inner surface of the shallow trenches;

Step 14: performing a single-step pre-heating process on the wafer;

Step 16: performing an HDPCVD process to fill a silicon oxide layer into the shallow trenches; and Step 18: performing a CMP process to remove the silicon oxide layer outside the shallow trenches.

The steps of forming STIs are detailed as follows. Please refer to FIG. 2 through FIG. 4. FIG. 2 through FIG. 4 are schematic diagrams illustrating a conventional STI process. As shown in FIG. 2, a wafer 20 is provided. Then, a pad oxide pattern 22 and a pad nitride pattern 24 are consecutively formed on the wafer 20. Subsequently, an etching process using the pad nitride pattern 24 as a hard mask is performed to form shallow trenches 26. Following that, a silicon oxide liner 27 and a silicon nitride liner 28 are respectively formed on the inner wall of the shallow trench 26.

The wafer 20 is then delivered to an HDPCVD chamber 30 for forming STIs. The HDPCVD chamber 30 includes a chamber body 32, an E-chuck 34 for supporting the wafer 20, a back-side cooling system 36, a bias RF power 38 coupled to the E-chuck 34, a plurality of inductive coils 40 and 42 respectively disposed on the top and sides of the chamber body 32, a top RF power 44 coupled to the inductive coils 40, and a side RF power 46 coupled to the inductive coils 42. The process temperature of an HDPCVD process is high, for example 700 Celsius degrees, and the wafer 20 has to be pre-heated in advance. Normally, a pre-heating process is performed to raise the temperature of the wafer 20 to about 500 Celsius degrees. During the pre-heating step, power is applied to the top RF power 44 and the side RF power 46, and gases such as oxygen or argon is implanted into the chamber body 32 to raise the temperature of the wafer 20.

As shown in FIG. 3, an HDPCVD process is then performed to fill a silicon oxide layer 48 into the shallow trenches 26. As shown in FIG. 4, a CMP process is performed to remove the silicon oxide layer 48 outside the shallow trenches 26 so as to form STIs 50.

The conventional pre-heating process is single step, and the wafer 20 is disposed on the E-chuck 34 while performing the pre-heating process, i.e. the wafer 20 is distant from the inductive coils 40 and 42 positioned overhead. Consequently, the temperature raising capability is insufficient. In addition, if a low pre-heating power is adopted, it takes more time to heat the wafer 20, and it is difficult to increase the temperature as desired. Under such a condition, the peeling issue of the silicon nitride liner 28 gets serious. On the other hand, if a high pre-heating power is adopted, it takes less time to heat the wafer 20 and the peeling issue of the silicon nitride liner 28 may be alleviated. However, the high pre-heating power enhances dropped particles, and leads to a particle issue. Therefore, the conventional method faces a dilemma of the peeling issue or the particle issue.

SUMMARY OF THE INVENTION

It is therefore a primary objective of the claimed invention to provide a method of preventing a peeling issue of a high stressed thin film.

According to the claimed invention, a method of preventing a peeling issue of a high stressed thin film is disclosed. The method includes providing a wafer having at least a high stressed thin film thereon, and performing a multi-step pre-heating process to heat the wafer.

According to the claimed invention, a method of preventing a peeling issue of a high stressed thin film is also disclosed. First, a wafer including a high stressed thin film thereon is provided. The wafer is then lifted, and a pre-heating process is performed while the wafer is lifted. Subsequently, a dielectric layer is deposited on the high stressed thin film.

The pre-heating process of the present invention is multi-step, and the wafer is lifted up while performing the pre-heating process. Consequently, the temperature of the wafer increases rapidly and steadily. As a result, both the peeling issue and the particle issue are prevented.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
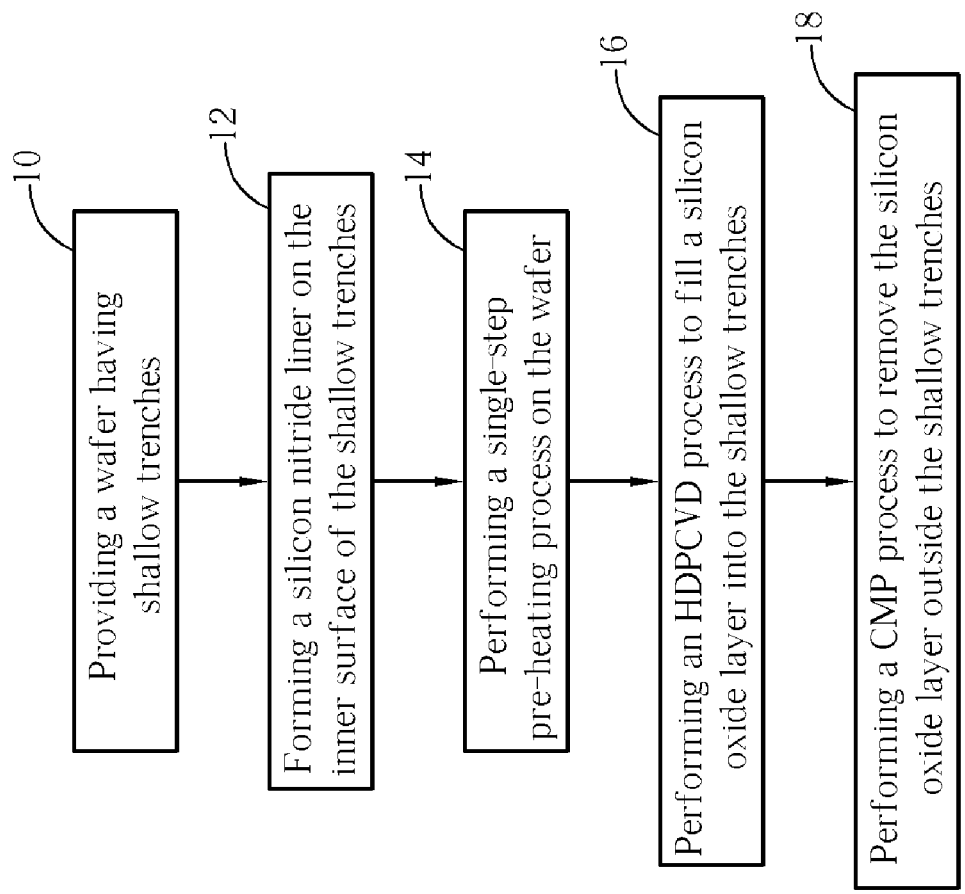
FIG. 1 is a flow chart of a conventional STI process.
Figure 2:
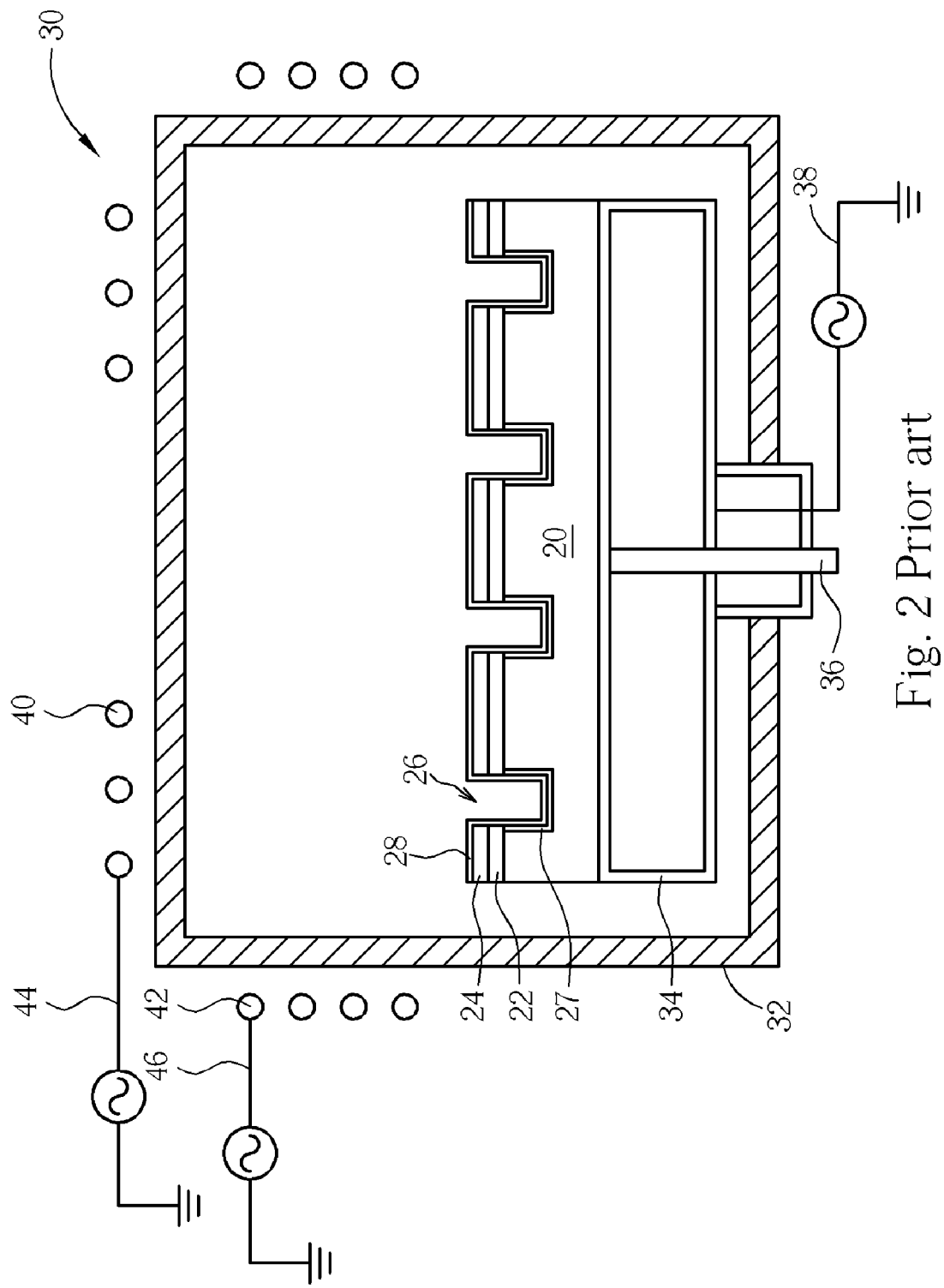
FIG. 2 through FIG. 4 are schematic diagrams illustrating a conventional STI process.
Figure 3:
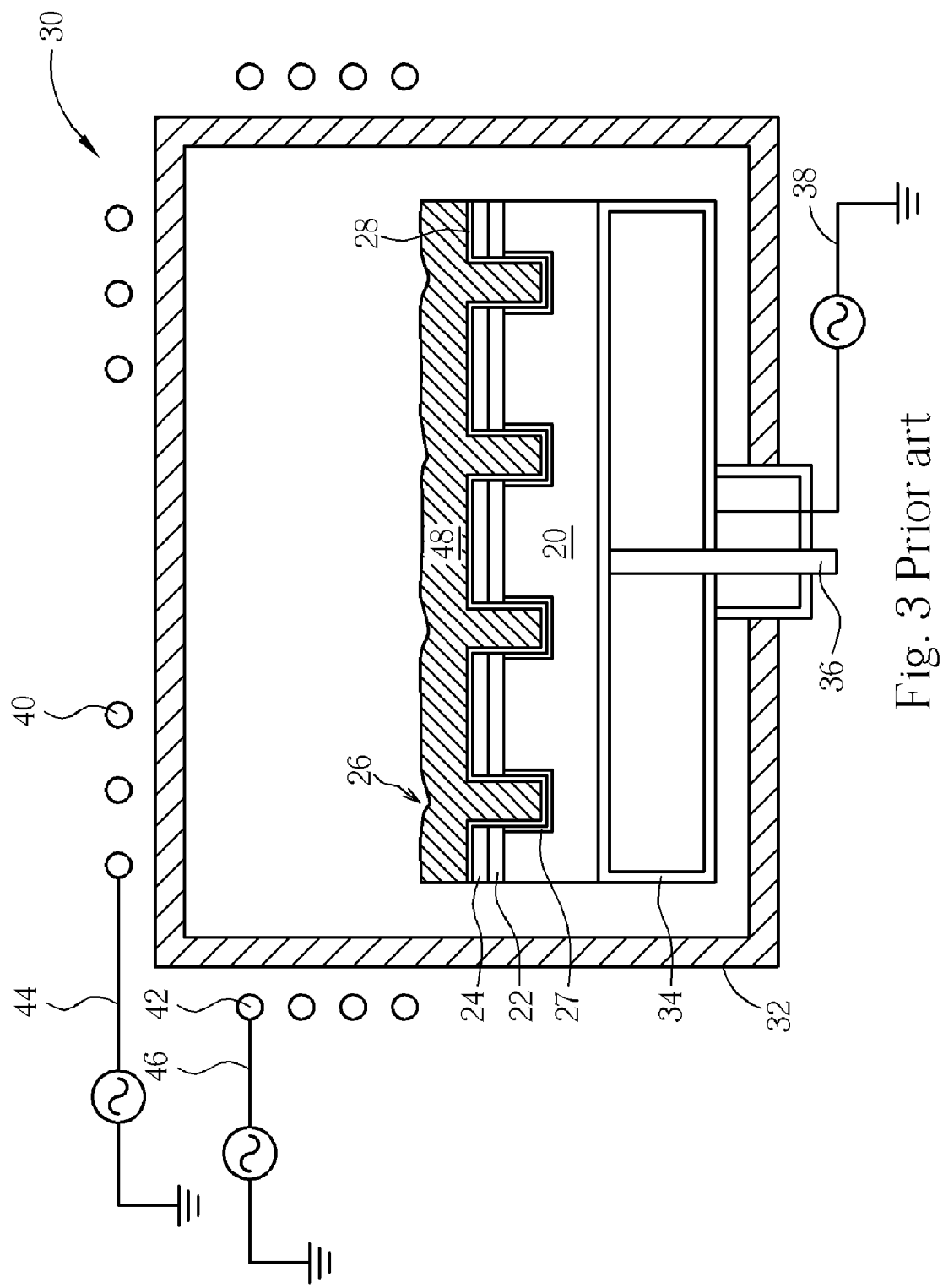
Figure 4:
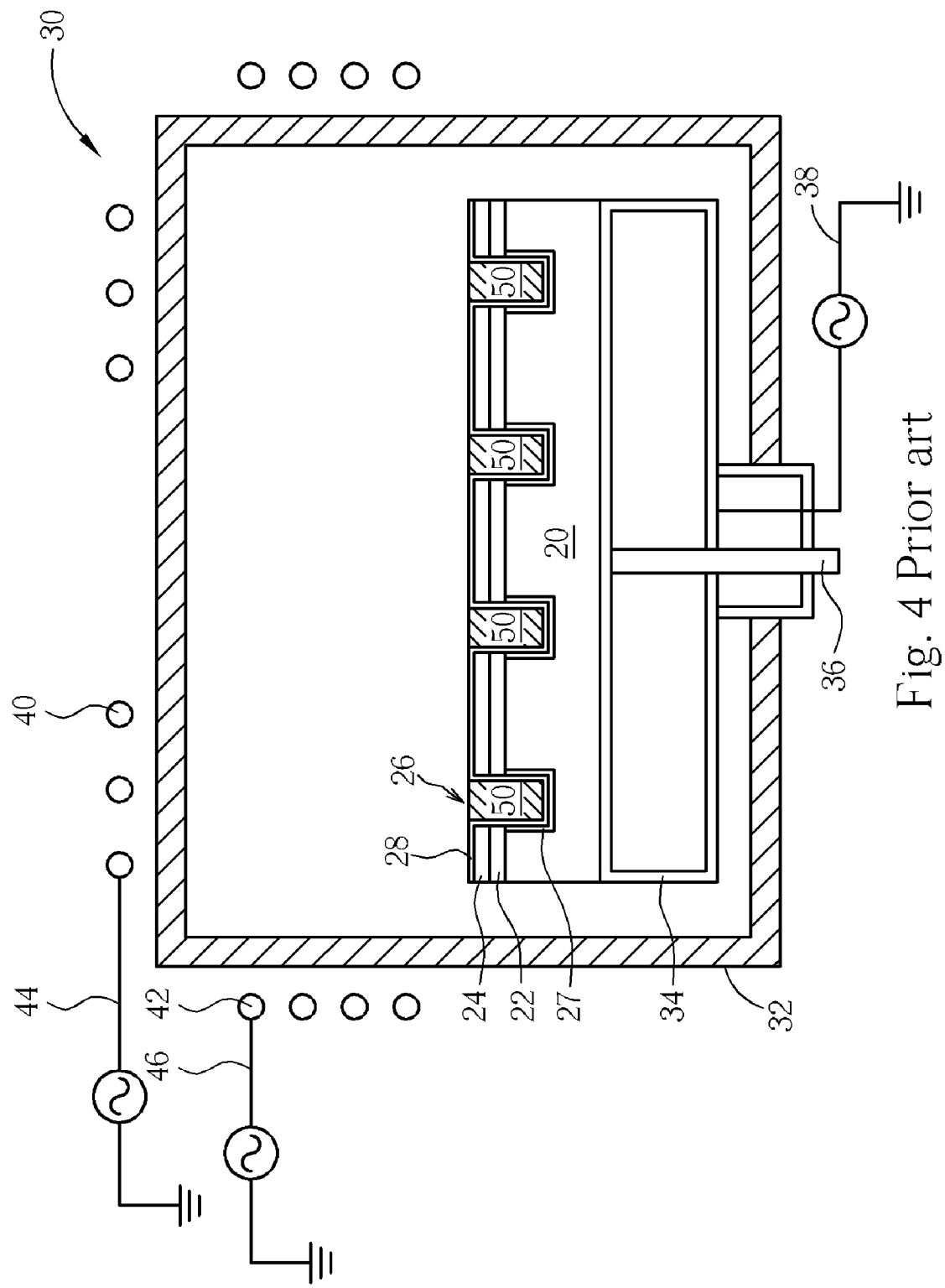
Figure 5:
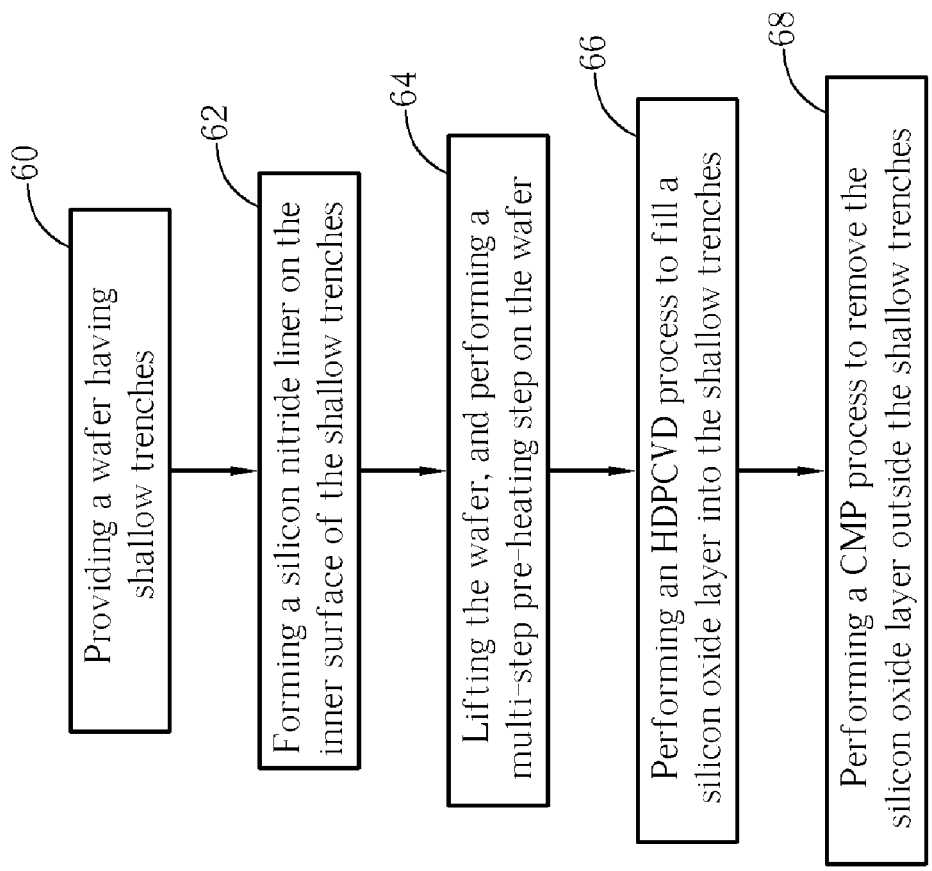
FIG. 5 is a flow chart illustrating an STI process including a multi-step pre-heating process according to a preferred embodiment of the present invention.

Please refer to FIG. 5. FIG. 5 is a flow chart illustrating an STI process including a multi-step pre-heating process according to a preferred embodiment of the present invention. As shown in FIG. 5, the method of the present invention includes the following steps:

Step 60: providing a wafer having shallow trenches;

Step 62: forming a silicon nitride liner on the inner surface of the shallow trenches;

Step 64: lifting the wafer, and performing a multi-step pre-heating step on the wafer;

Step 66: performing an HDPCVD process to fill a silicon oxide layer into the shallow trenches; and Step 68: performing a CMP process to remove the silicon oxide layer outside the shallow trenches.

The method of the present invention features by having a multi-step pre-heating process. In a preferred embodiment, the multi-step pre-heating process includes a low power pre-heating step, a medium power pre-heating step, and a high power pre-heating step performed consecutively while the wafer is lifted. This multi-step pre-heating process ensures a rapidly and steadily ramped-up temperature increase of the wafer. Consequently, both the peeling issue and the particle issue are prevented, thereby improving the yield of the successive HDPCVD process. The method of the present invention is detailed as follows.

Figure 6:
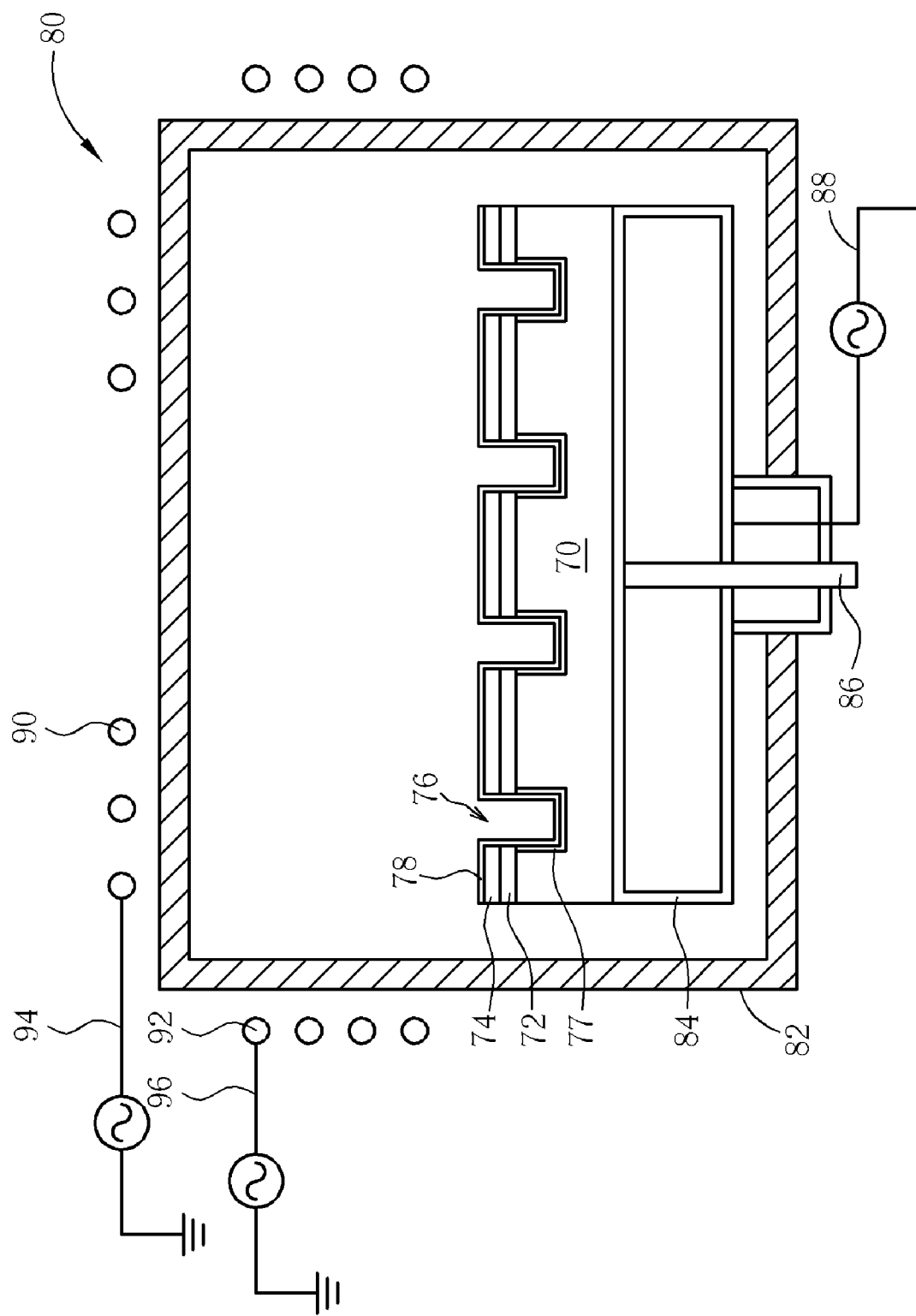
FIG. 6 through FIG. 8 are schematic diagrams illustrating an STI process according to a preferred embodiment of the present invention.
Figure 7:
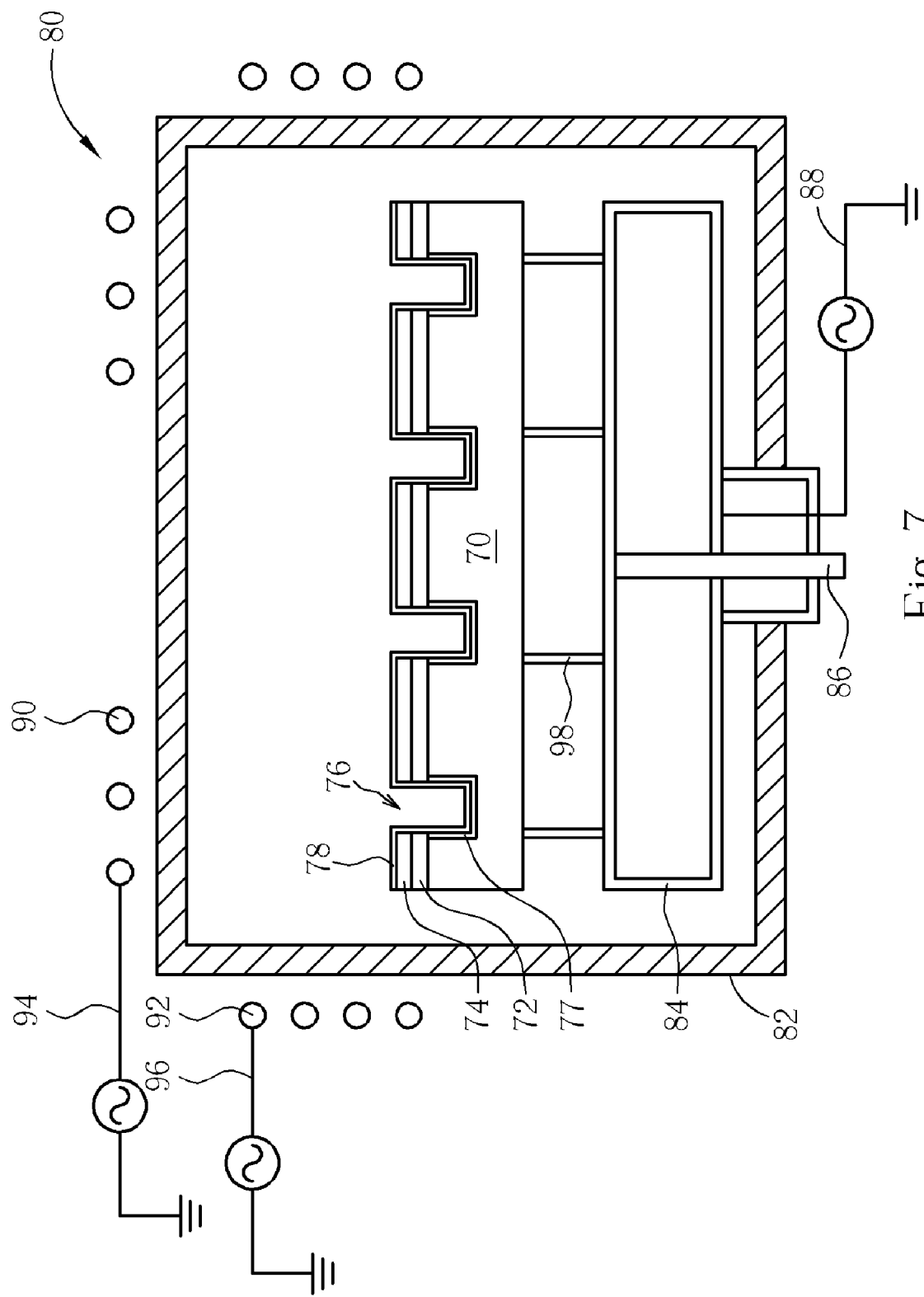
Figure 8:
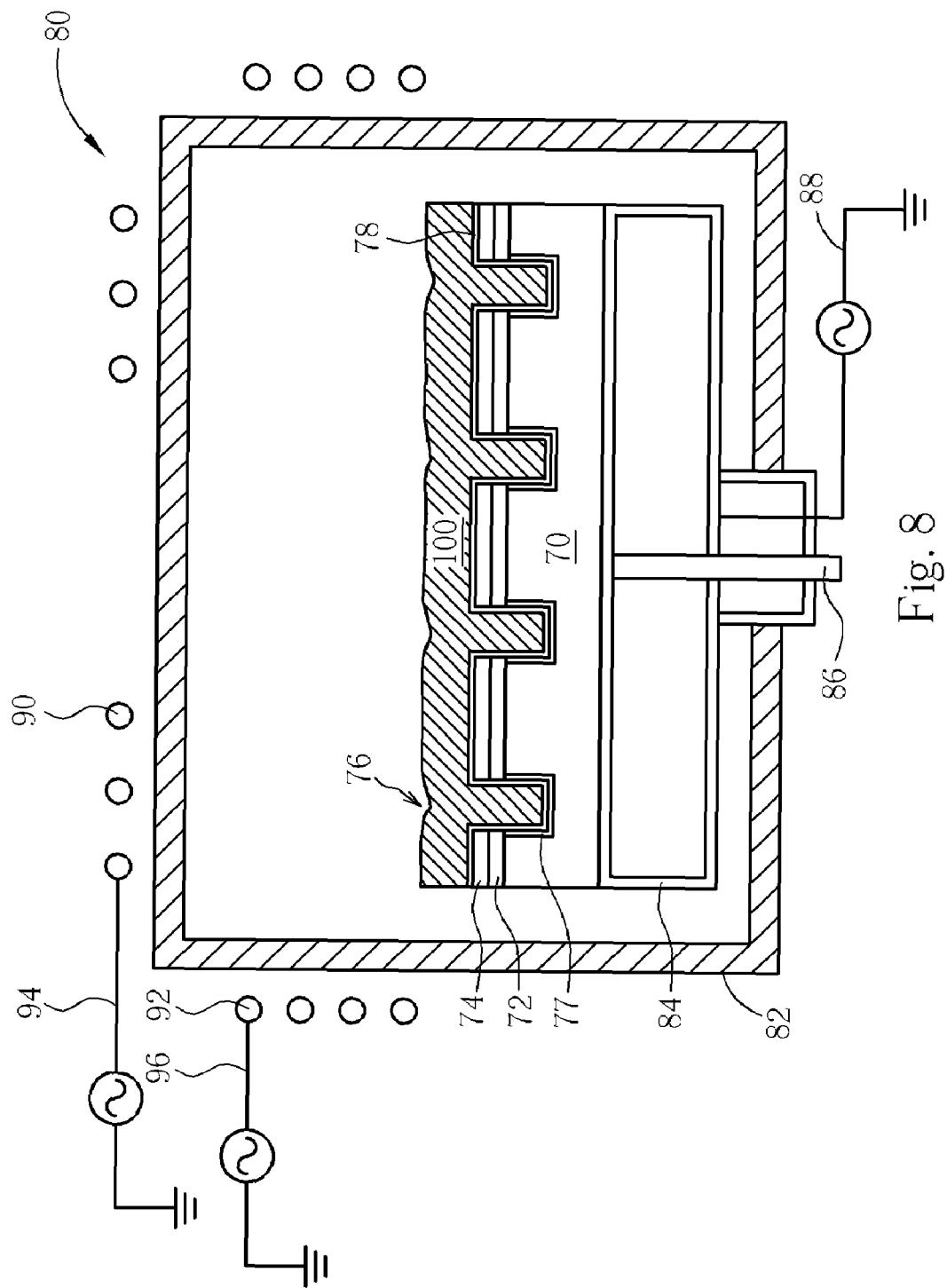

Please refer to FIG. 6 through FIG. 8. FIG. 6 through FIG. 8 are schematic diagrams illustrating an STI process according to a preferred embodiment of the present invention. As shown in FIG. 6, a wafer 70 is provided. The wafer 70 includes a pad oxide pattern 72, a pad nitride pattern 74, a plurality of shallow trenches 76, a silicon oxide liner 77, and a high stressed thin film 78, e.g. a silicon nitride liner, disposed on the inner wall of the shallow trenches 76.

Subsequently, the wafer 70 is delivered to an HDPCVD chamber 80. The HDPCVD chamber 80 includes a chamber body 82, an E-chuck 84 for supporting the wafer 70, a backside cooling system 86, a bias RF power 88 coupled to the E-chuck 84, a plurality of inductive coils 90 and 92 respectively disposed on the top and sides of the chamber body 82, a top RF power 94 coupled to the inductive coils 90, a side RF power 96 coupled to the inductive coils 92, and pins 98 (not shown in FIG. 6) equipped in the E-chuck 84.

As shown in FIG. 7, the wafer 70 is lifted up with the pins 98 prior to the multi-step pre-heating process. This lifting step aims to make the wafer 70 closer to the inductive coils 90 and 92 disposed overhead, so that the temperature rises rapidly in the successive pre-heating process. Following that, a multi-step pre-heating process is performed to pre-heat the wafer 70. In this embodiment, the multi-step pre-heating process includes a low power pre-heating step, a medium power pre-heating step, and a high power pre-heating step consecutively performed to ramp up the temperature of the wafer 60 rapidly and constantly. Also, the multi-step pre-heating process is performed while the wafer 70 is lifted up. In this embodiment, the top RF power of the low power pre-heating step is between 1100 W and 1500 W (preferably 1300 W), the side RF power is between 2900 W and 3300 W (and preferably 3100 W), and the process time is about 80 seconds. The top RF power of the medium power pre-heating step is between 2300 W and 2700 W (preferably 2500 W), the side RF power is between 3300 W and 3700 W (preferably 3500 W), and the process time is about 25 seconds. The top RF power of the high power pre-heating step is between 2800 W and 3200 W (preferably 3000 W), the side RF power is between 3800 W and 4200 W (preferably 4000 W), and the process time is about 5 seconds.

As shown in FIG. 8, the wafer 70 is lowered to a normal position after the multi-step pre-heating process, and an HDPCVD process is then performed to fill a silicon oxide layer 100 into the shallow trenches 76.

Figure 9:
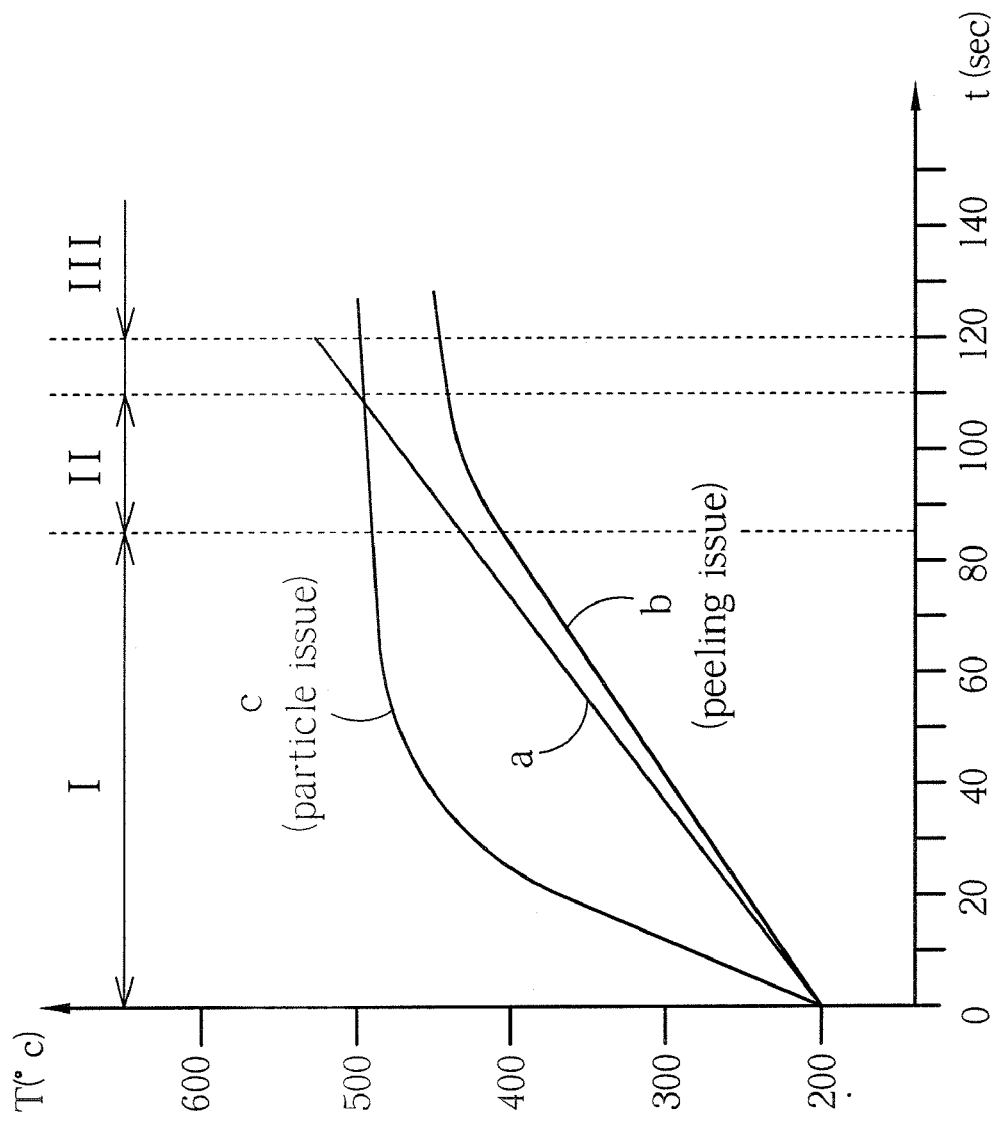
FIG. 9 is a chart illustrating a temperature vs. time relation in the multi-step pre-heating process according to the above embodiment of the present invention.
Figure 10:
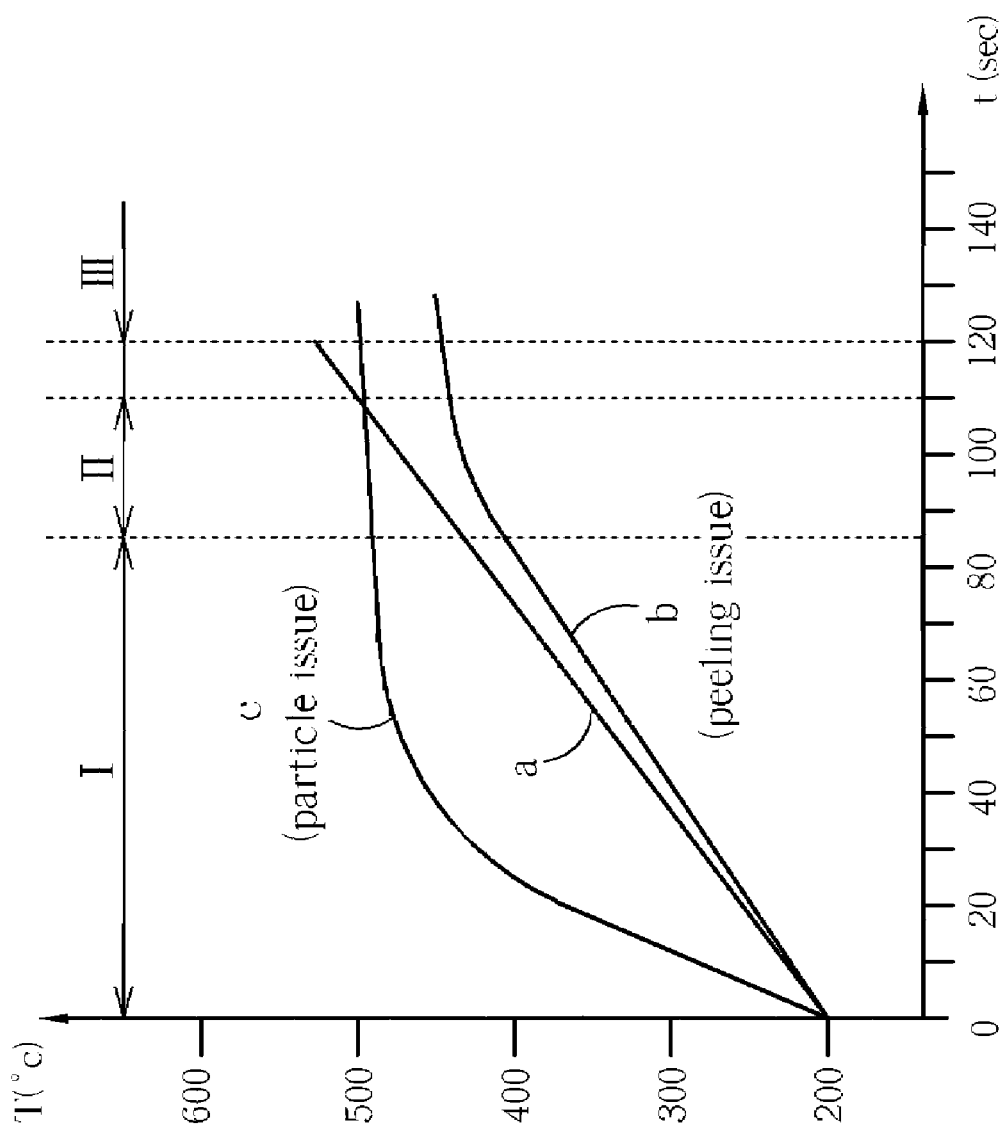

Please refer to FIG. 9. FIG. 9 is a chart illustrating a temperature vs. time relation in the multi-step pre-heating process according to the above embodiment of the present invention. In FIG. 9, curve a represents the temperature vs. time relation of the multi-step pre-heating process while the wafer is lifted up in accordance with the present invention, curve b represents the temperature vs. time relation of a conventional low power single-step pre-heating process while the wafer is not lifted, and curve c represents the temperature vs. time relation of a conventional high power single-step pre-heating process while the wafer is not lifted. In addition, sections I, II, and III respectively represent a low power pre-heating step, a medium power pre-heating step, and a high power pre-heating step. The parameters of the multi-step pre-heating process are as above disclosed. As shown in FIG. 9, the original temperature of the wafer is about 200 Celsius degrees, and the temperature of the wafer increases steadily from 200 to 500 Celsius degrees by virtue of the multi-step pre-heating process. As for curve b, the temperature of the wafer increases slowly because the pre-heating power is low and the wafer is not lifted. The temperature may never reach 500 Celsius degrees, and peeling issue is serious under this condition. As for curve c, on the other hand, the temperature of the wafer increases rapidly in the beginning because the pre-heating power is high. However, since the wafer is not lifted, the temperature increase becomes much slower in the end. High RF power for long time and steep wafer temperature rising trend leads to a serious particle issue.

It is to be noted that the method of the present invention is not limited to be adopted in an STI process, and can be applied to any pre-heating processes prior to a deposition process. In addition, the multi-step pre-heating process is not limited to three steps as disclosed in the embodiment. It may contain more or less steps by adjusting the parameters or for meeting other requirements.

In comparison with the conventional pre-heating process, the pre-heating process of the present invention is multi-step, and the wafer is lifted up while performing the pre-heating process. Consequently, the temperature of the wafer increases rapidly and steadily. As a result, both the peeling issue and the particle issue are prevented.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of preventing a peeling issue of a high stressed thin film, comprising:

providing a wafer comprising at least a high stressed thin film thereon, wherein the wafer is disposed in a chamber body having a plurality of inductive coils disposed on the top or the side of the chamber body;

lifting the wafer to make the wafer closer to the inductive coils; and performing a multi-step pre-heating process to heat the wafer that the temperature of the wafer increases in a linear manner during the multi-step pre-heating process;

wherein the multi-step pre-heating process comprises consecutively performing a low power pre-heating step, a medium power pre-heating step, and a high power pre-heating step.

2. The method of claim 1, wherein the low power pre-heating step has a top power of between 1100 W and 1500 W, and a side power of between 2900 W and 3300 W.

3. The method of claim 1, wherein the medium power pre-heating step has a top power of between 2800 W and 2700 W, and a side power of between 3300 W and 3700 W.

4. The method of claim 1, wherein the high power pre-heating step has a top power of between 2800 W and 3200 W, and a side power of between 3800 W and 4200 W.

5. The method of claim 1, wherein the high stressed thin film is a silicon nitride liner.

6. The method of claim 1, further comprising depositing a dielectric layer on the high stressed thin film.

7. The method of claim 6, wherein the dielectric layer is deposited by an HDPCVD process.

8. The method of claim 6, wherein the dielectric layer is a silicon oxide layer.

9. The method of claim 1, wherein the method is adopted in a shallow trench insulator (STI) process.

10. A method of preventing a peeling issue of a high stressed thin film, comprising:

providing a wafer comprising a high stressed thin film thereon, wherein the wafer is disposed in a chamber body having a plurality of inductive coils disposed on the top or the side of the chamber body;

lifting the wafer to make the wafer closer to the inductive coils;

performing a pre-heating process while the wafer is lifted, the pre-heating process comprising consecutively performing a low power pre-heating step and a medium power pre-heating step prior to a high power pre-heating step;

lowering the wafer; and depositing a dielectric layer on the high stressed thin film.

11. The method of claim 10, wherein the high power pre-heating step has a top power of between 2800 W and 3200 W, and a side power of between 3800 W and 4200 W.

12. The method of claim 10 wherein the low power pre-heating step has a top power of between 1100 W and 1500 W, and a side power of between 2900 W and 3300 W.

13. The method of claim 10, wherein the medium power pre-heating step has a top power of between 2300 W and 2700 W, and a side power of between 3300 W and 3700 W.

14. The method of claim 10, wherein the high stressed thin film is a silicon nitride liner.

15. The method of claim 10, wherein the dielectric layer is deposited by an HDPCVD process.

16. The method of claim 10, wherein the method is adopted in a shallow trench insulator (STI) process.

17. The method of claim 10, wherein the dielectric layer is a silicon oxide layer.

* * * * *